United States Patent [19]

Takagi et al.

[11] 4,194,927
[45] Mar. 25, 1980

[54] SELECTIVE THERMAL OXIDATION OF AS-CONTAINING COMPOUND SEMICONDUCTOR REGIONS

[75] Inventors: Hiromitsu Takagi, Muko; Gota Kano, Nagaokakyo; Iwao Teramoto, Ibaraki, all of Japan

[73] Assignee: Matsushita Electric Industrial Co., Ltd., Kadoma, Japan

[21] Appl. No.: 923,689

[22] Filed: Jul. 11, 1978

[30] Foreign Application Priority Data

Jul. 15, 1977 [JP] Japan .................................. 52-85228
Jul. 18, 1977 [JP] Japan .................................. 52-86383
Feb. 24, 1978 [JP] Japan .................................. 53-21399

[51] Int. Cl.² .......................... H01L 7/36; H01L 7/44
[52] U.S. Cl. ...................................... 148/1.5; 148/175; 156/662; 427/86
[58] Field of Search .............. 148/1.5, 175; 427/86, 427/87; 156/662

[56] References Cited

U.S. PATENT DOCUMENTS

| | | | |
|---|---|---|---|
| 3,798,139 | 3/1974 | Schwartz | 204/56 R |
| 3,856,588 | 12/1974 | Hashimoto et al. | 148/188 |
| 3,890,169 | 6/1975 | Schwartz et al. | 148/187 |
| 3,907,616 | 9/1975 | Wiemer | 148/188 |
| 3,909,321 | 9/1975 | Roberts | 148/190 |
| 3,992,233 | 11/1976 | Farrow | 148/175 |
| 4,002,505 | 1/1977 | Bult | 148/20.3 |
| 4,095,004 | 6/1978 | Fraas et al. | 427/74 |

OTHER PUBLICATIONS

Rubenstein, ". . Oxidation of . . . GaAs" J. Elechrochem. Soc. 113 (1966) 540.

Primary Examiner—L. Dewayne Rutledge
Assistant Examiner—Upendra Roy
Attorney, Agent, or Firm—Cushman, Darby & Cushman

[57] ABSTRACT

In the process of forming a thermal oxide film or heat treatment of an oxide film in making a semiconductor device comprising a compound semiconductor of arsenic, the semiconductor is handled in an atmosphere containing arsenic oxide vapor in order to prevent evaporation of the arsenic tri-oxide in the thermal oxidation film or the oxide film under heat treatment, thereby to form a thermal oxide film having good chemical stability and good electrical characteristics, or to improve the oxide film so as to have good chemical stability and good electrical characteristics.

25 Claims, 10 Drawing Figures

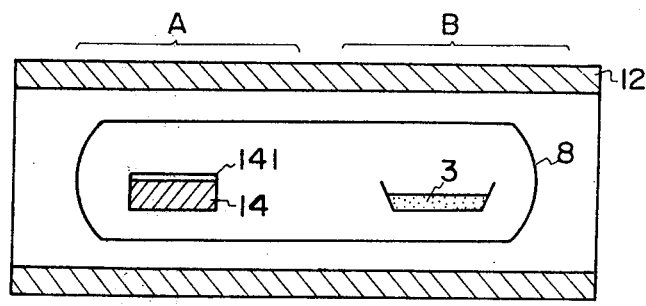
FIG. 5
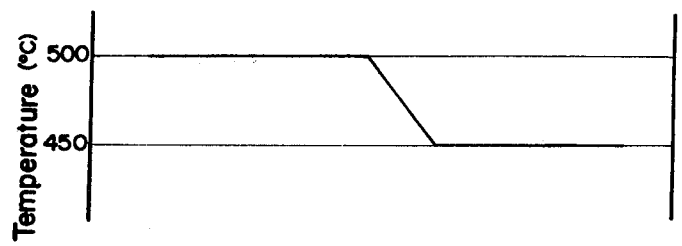
FIG. 6
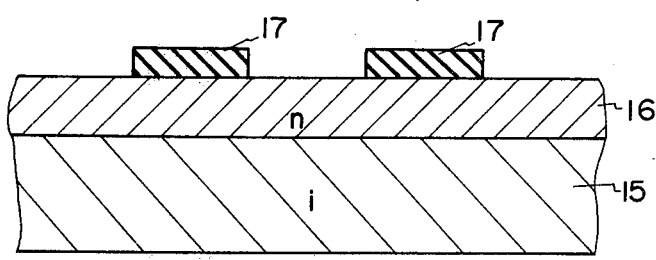
FIG. 7
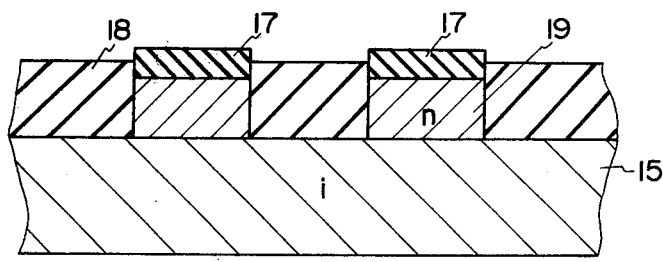
FIG. 8
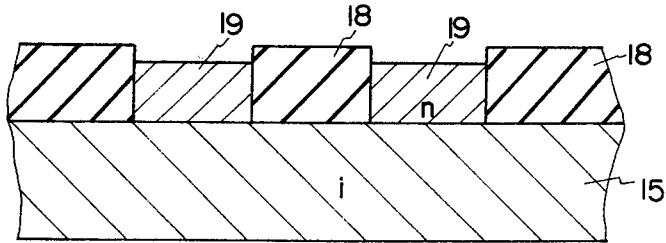

SELECTIVE THERMAL OXIDATION OF AS-CONTAINING COMPOUND SEMICONDUCTOR REGIONS

BACKGROUND OF THE INVENTION

1. Field of the Invention

The present invention relates to an improvement in a method of making a semiconductor device comprising a compound semiconductor of arsenic.

More specifically, the present invention relates to a method of forming a thermal oxidation film containing arsenic in the manufacture of a semiconductor device comprising a compound semiconductor of arsenic.

2. Description of the Prior Art

Recently, semiconductor devices containing a semiconductor compound, for example, gallium arsenide have been studied because they have satisfactory high-frequency characteristics. However, since they principally consist of compound semiconductors instead of a semiconductor of single element of the conventional semiconductor device, when a heat treatment is applied thereto for forming a thermal oxidation layer or for annealing an oxidation layer to stabilization, several problems take place, for which the compound semiconductor devices require further development.

In general, various heat treatments are carried out in making semiconductor devices, for example, for forming a thermal oxidation film, annealing the gate oxide film, forming an isolation film by selective oxidation, and so on.

Conventional ways of conducting the heat treatment of the compound semiconductor containing arsenic are elucidated hereafter.

For forming the thermal oxidation film of the compound semiconductor, a substrate of the compound semiconductor, for example, gallium arsenide is disposed in an open tube, and the substrate is heat-treated at a temperature of 500° C.-600° C. by a flow of the reaction gas consisting of air, oxygen, or steam. Annealing for stabilization of the gate oxide film of compound semiconductor is made by exposing the oxide film, which is formed by an anodic oxidation method, to a flow of a reaction gas of one or a mixture of hydrogen, nitrogen and oxygen, at a temperature of above 300° C. in an open tube.

However, the conventional arsenic-containing compound semiconductor devices made by the conventional heat treatment process have drawbacks, for example, such that the gate oxide film of MOS FETs have low specific resistivities hence have a poor breakdown voltage and leakage current for actual use.

When an anodic oxide film, which is known as being superior in electric characteristics to the thermal oxide film, is used for the isolation region in order to obtain a flat finished face, there is a problem that the anodic oxide film is chemically unstable and hence is likely to be damaged by a chemical solution such as an etchant, and accordingly, it has been difficult to manufacture a semiconductor integrated circuit comprising the arsenic-containing compound semiconductor.

The inventors herein have made various studies of the conventional thermal oxide films, and found the following conclusions:

(1) In the conventional heat treatment for forming a thermal oxide film, oxides mainly of gallium sesqui-oxide ($Ga_2O_3$) and arsenic tri-oxide are formed on the principal face of the substrate. However, since the vapor pressure of the arsenic tri-oxide is more than 1 atmosphere at the abovementioned temperature of the heat treatment, a considerable portion of the arsenic tri-oxide in said thermal oxide film evaporates, thereby resulting in the formation of an oxide film consisting principally of gallium sesqui-oxide and having a relatively low specific resistivity.

(2) Also, in the heat treatment for annealing a gate oxide film or for forming a selective oxidation film, the arsenic trioxide is likely to evaporate, thereby changing the composition into that consisting principally of gallium sesqui-oxide and having a relatively low specific resistance.

SUMMARY OF THE INVENTION

The principal purpose of the present invention is to provide a method of making a compound semiconductor device having an oxide film, which is chemically stable and has good electric characteristics.

BRIEF DESCRIPTION OF THE INVENTION

FIG. 5 is a schematic sectional elevation view showing still another example of the apparatus for heat treatment of the present invention together with a temperature distribution chart of the apparatus.

FIG. 6 to FIG. 8 are sectional elevation views showing the manufacture steps of a further example in accordance with the present invention.

DESCRIPTION OF THE INVENTION

The heat treatment of the present invention is characterized by conducting the heat treatment in an atmosphere containing vapor of arsenic oxide.

Figure 1:
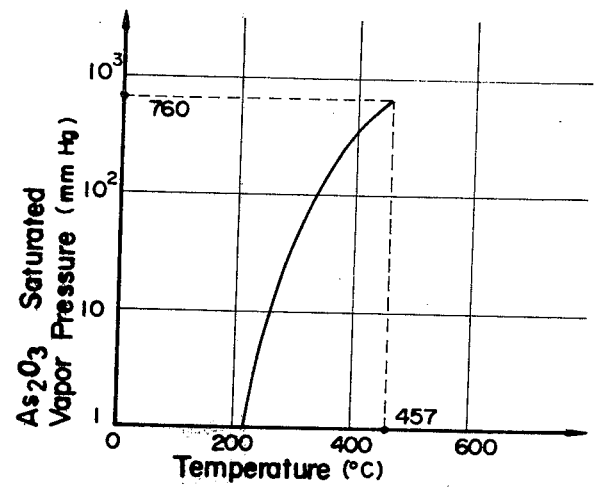
FIG. 1 is a graph showing the relationship between temperature and saturation vapor pressure of arsenic tri-oxide.
Figure 2:
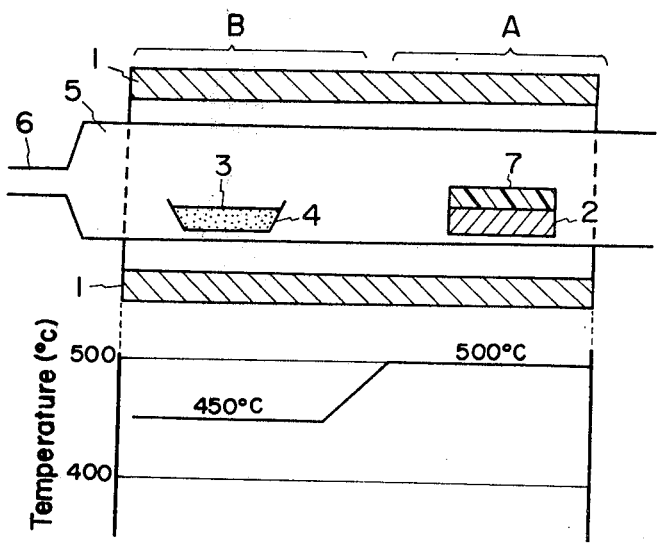
FIG. 2 is a schematic sectional elevational view showing one example of the apparatus conducting the heat treatment of the present invention together with the temperature distribution chart of the apparatus.

FIG. 2 shows one example of the apparatus for making a compound semiconductor in accordance with the present invention. As shown in FIG. 2, in a reaction tube 5 of an electric furnace 1 having a higher temperature region A and a lower temperature region B, a substrate 2 of gallium arsenide (GaAs) is placed in the higher temperature region A, and a platinum boat 4 containing powder or lump of arsenic tri-oxide 3 as a source of the arsenic tri-oxide is placed in the lower temperature region B. In the example, the higher temperature region A is set at a temperature of about 500° C. and the lower temperature region B is set at a temperature of about 450° C. When oxygen as a carrier gas is fed from a feeding port 6 into the reaction tube 5, the gallium arsenide substrate 2 reacts with the oxygen thereby to form an oxide film 7 on its face. The oxide film consists mainly of a mixed composition of the gallium sesqui-oxide and arsenic tri-oxide. Vapor pressure of the arsenic tri-oxide in the $Ga_2O_3$—$As_2O_3$ film at the temperature of 500° C. is about 700 mmHg as shown in FIG. 1, while the carrier gas flow is caused to contain a vapor of arsenic oxide when passing on the arsenic tri-oxide lump disposed in the lower temperature region B of about 450° C. The vapor pressure of the latter vapor is at least 700 mmHg at the temperature of 450° C. Strictly speaking, the vapor of the arsenic oxide comprises $As_2O_3$ (arsenic tri-oxide) and $As_4O_6$, and the latter becomes dominant as the temperature rises. In general, such a mixed vapor is called arsenic tri-oxide vapor. The evaporation of the arsenic tri-oxide from the oxide film 7 is effectively suppressed by the vapor of arsenic oxide produced by the flow of oxygen on the arsenic tri-oxide source 3 on the platinum boat 4, and therefore, the arsenic tri-oxide in the oxide film 7 hardly evaporates. Besides, since the gallium arsenide substrate 2 is disposed in the higher temperature region, there is no fear of the arsenic tri-oxide depositing on the face of the substrate 2.

The abovementioned example is for the case that the temperature of the substrate 2 is about 500° C. However, the temperature of the substrate 2 in the reaction tube 5 is not necessarily limited to this temperature. Instead, other temperatures can be used, such that the temperatures of the substrate 2 and the arsenic tri-oxide source 3 are selected in a manner that the vapor pressure of the arsenic tri-oxide in the $Ga_2O_3$—$As_2O_3$ film 7 is equal to or lower than the arsenic oxide gas from the arsenic tri-oxide source 3. The oxide film on the gallium arsenide thus formed contains gallium sesqui-oxide and arsenic tri-oxide at the equivalent mol ratio.

Figure 3:
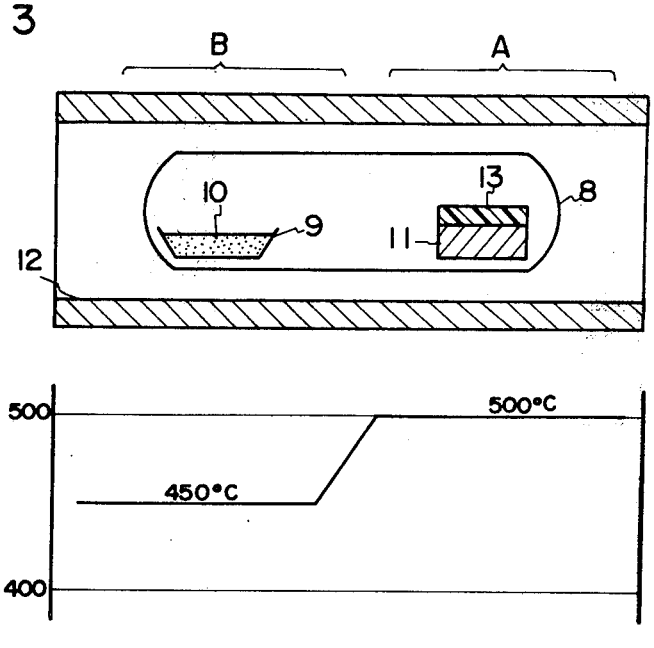
FIG. 3 is a schematic sectional elevational view showing another example of the apparatus for conducting the heat treatment of the present invention together with a temperature distribution chart of the apparatus.

The thermal reaction can be made also in a sealed reaction tube as shown in FIG. 3, whenever the abovementioned condition is fulfilled, and FIG. 3 shows an example of the apparatus for making the semiconductor device in a sealed tube or ampoule. A substrate 11 of gallium arsenide and a platinum boat 9 containing arsenic tri-oxide powder 10 are sealed in an evacuated quartz ampoule 8, and the ampoule 8 is placed in an electric furnace 12, which has a higher temperature region A and a lower temperature region B, having temperatures of about 500° C. and 450° C. for the substrate and the arsenic tri-oxide source, respectively.

Figure 4:
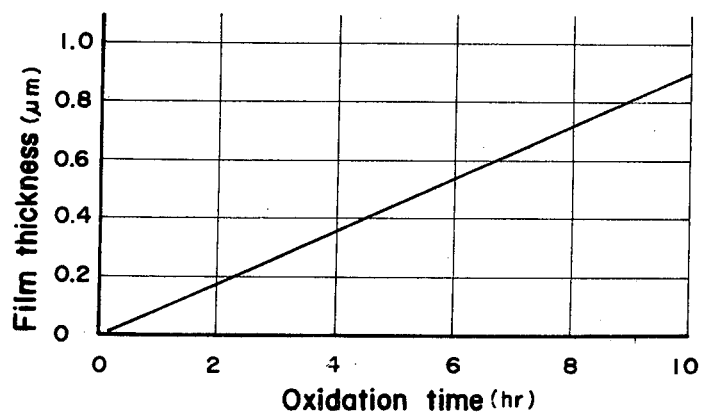
FIG. 4 is a graph showing the relationship between the oxidation time period and the thickness of the oxide film.

In this apparatus, since the arsenic oxide vapor having vapor pressure of about 700 mmHg is produced from the source on the platinum boat containing the arsenic tri-oxide, evaporation of the arsenic tri-oxide from the oxide film 13 is suppressed, and oxidation of the principal face of the gallium arsenide substrate 11 is carried out to form an oxide film 13 of satisfactory characteristics having the content of gallium sesqui-oxide and arsenic tri-oxide with equivalent mol ratio thereof in the substrate 11. The sealed ampoule method of this example is more convenient in controlling the vapor pressure of the arsenic oxide than the open tube method of FIG. 2. FIG. 4 shows the relationship between the thickness of the oxide film and the time period of oxidation. As shown in the graph of FIG. 4, the growth rate of the oxide film 13 is about 15 Å/minute, and is mainly decided by the temperature of the gallium arsenide substrate 11, but is only slightly affected by the temperature of the arsenic tri-oxide.

FIG. 5 shows a third example of the present invention, wherein a substrate 14 of gallium arsenide with an oxide film 141, which has been preliminarily formed by, for example, an anodic oxidation method, and an arsenic tri-oxide powder 3 in a platinum boat are sealed in a quartz ampoule 3, and the ampoule is placed in an electric furnace 12, which has a higher temperature region A and a lower temperature region B, having temperature of about 500° C. and 450° C. for the substrate 14 and the arsenic tri-oxide source 3, respectively. Then, the ampoule is filled with a vapor of arsenic tri-oxide having a vapor pressure of about 700 mmHg. Since the vapor pressure of the arsenic tri-oxide in the oxide film on the gallium arsenide substrate is also about 700 mmHg at the temperature of 500° C., the evaporation of the arsenic tri-oxide from the oxide film during the heat treatment is effectively prevented. Therefore, the heat treatment can be made without changing the component of the oxide film. The temperature can be selected as high as possible under the condition that the vapor pressure of the arsenic tri-oxide from the source is equal to or higher than that of the arsenic tri-oxide in the oxide film 141.

FIGS. 6 to 8 show a fourth example of making discrete devices utilizing a compound semiconductor or forming isolation zones for forming two or more semiconductor devices in an integrated circuit. FIGS. 6 to 8 show sectional election views of the steps of the example. As shown in FIG. 6, and oxidation preventing film 17, for example, of silicon nitride ($Si_3N_4$) is formed on the part to form island region on the n-type conductivity gallium arsenide layer 16 formed on the semi-insulative gallium arsenide substrate 15. Then, by heat-treating the substrate in an arsenic tri-oxide vapor of controlled vapor pressure, thermal oxidation of the gallium arsenide 18 is made only on the part not covered by the oxidation preventing film 17. The thermal oxidation is made in arsenic trioxide vapor in a sealed tube wherein the gallium arsenide substrate 15 is kept at about 500° C. and the arsenic trioxide source is kept at about 470° C. to produce an arsenic tri-oxide vapor of 800 mmHg. The growth rate of the oxide film is about 15 Å/minute and the produced oxide film has the specific resistance of about $10^{12}$ $\Omega$cm, which value is sufficiently high for electric isolation between the devices, and the resultant oxide film has a satisfactory chemical resistance. The oxidation should be continued until the bottom of the oxide film 18 reaches at least the upper face of the gallium arsenide substrate 15. When such oxidation is made, the thickness of the oxide film 18 becomes thicker by about 30% than that of the original semiconductor layer, thereby forming protrusion above the surface, as shown in FIG. 7.

Then, the silicon nitride film 17 is removed by gas plasma etching or by chemical etching using phosphoric acid, thereby forming two island regions 19 and 19 which are isolated by the oxide region 18. As a result of the abovementioned steps, the difference of the level between the surfaces of the oxide film and the island regions 19 and 19 is about 30% of the thickness of the island regions 19, 19, which is much smaller than the difference of the level of the conventional compound semiconductor devices having air isolation grooves, which are vacant grooves formed by chemical etching engraved to reach an i-type substrate. By decreasing the level difference of the substrate surface in the abovementioned manner, the possibility of breaking-off of the wiring conductor film on the substrate surface can be drastically eliminated. Furthermore, when protruding parts of the oxide film 18 are removed by etching, the surfaces of the oxide film part 18 and the island parts 19 and 19 can be made in a same level with each other.

Then, the wiring conductor film on the substrate surface can be made almost flat thereby increasing reliability.

The abovementioned example of FIGS. 6–8 is only for the case utilizing semiinsulative GaAs for the starting substrate, but other insulative substrates can be utilized to make integrated circuits comprising isolated devices.

Figure 9:
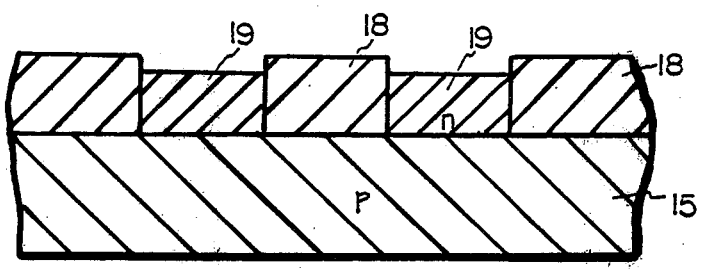
FIGS. 9 and 10 are sectional elevation views of modified examples in accordance with the present invention.
Figure 10:
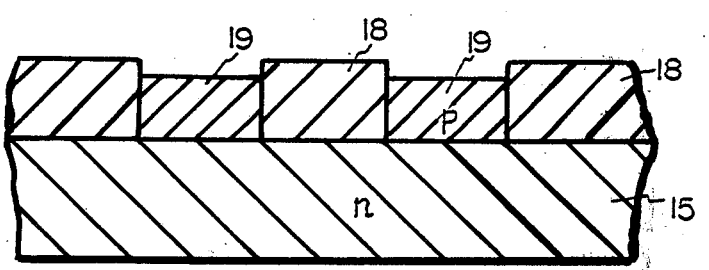

A modified construction using the steps of FIGS. 6 to 8 is that on a GaAs substrate of one conductivity type, several GaAs regions of an opposite conductivity type are formed with an isolating oxide film 18 inbetween, as shown in FIGS. 9 and 10.

As has been described in detail, the method of the present invention enables suppression of undesirable evaporation of the arsenic trioxide from the oxide film of the GaAs substrate, thereby forming the oxide film of high resistivity containing arsenic tri-oxide of the equivalent mol to the gallium sesqui-oxide. Therefore, compound semiconductor devices, for example, MOS FETs made according to the present invention have satisfactory electric characteristics. Also, isolation of integrated circuits or discrete devices using a compound semiconductor can be made by selective oxidation in accordance with the present invention, and therefore, the wiring conductor is formed on a flat surface, and as a result reliability of the wiring conductor is much improved. Accordingly, great development of the planar technology of the compound semiconductor device can be expected.

The vapor of the arsenic oxide can be made by reacting a carrier gas containing oxygen with solid phase arsenic.

What we claim is:

1. A method of making a semiconductor device including at least a compound of arsenic in a portion thereof, said method comprising heat treating said semiconductor device in a vapor containing arsenic oxide whereby an oxide film containing arsenic oxide is deposited thereon.

2. The method of claim 1 wherein the arsenic oxide contained in said vapor is arsenic tri-oxide containing $As_4O_6$.

3. The method of claim 1 wherein the compound of arsenic in the resulting semiconductor device is a compound semiconductor.

4. The method of claim 3 wherein said compound semiconductor is gallium arsenide.

5. The method of claim 1 including selectively forming an oxidation preventing film on predetermined portions of the surface of said semiconductor device prior to said heat-treatment.

6. The method of claim 1 wherein the deposited oxide film containing arsenic oxide on the substrate is annealed by said heat treatment.

7. The method of claim 1 wherein the vapor is formed by evaporation from a solid phase arsenic oxide.

8. The method of claim 7 wherein said semiconductor device and said solid phase arsenic oxide are placed in a furnace having a higher temperature region and a lower temperature region, respectively, such that said semiconductor device is placed in said higher temperature region and said solid phase arsenic oxide is placed in said lower temperature region.

9. The method of claim 1, 2 or 3 wherein said vapor is formed by flowing a carrier gas containing oxygen onto arsenic and reacting with said arsenic.

10. The method of claim 9 wherein the temperature of said lower temperature region is at between about 450° and about 500° C.

11. The method of claim 9 wherein the temperature difference between said higher temperature region and said lower temperature region is less than about 50 centigrade degrees.

12. A method of making a compound semiconductor device, including at least one compound of arsenic in a portion thereof comprising heat-treating said compound semiconductor device in a vapor containing arsenic oxide whereby a thermal oxide film of said compound semiconductor is formed thereon.

13. The method of claim 12 wherein said arsenic oxide is arsenic tri-oxide containing $As_4O_6$.

14. The method of claim 13 wherein said compound semiconductor device is composed of a gallium arsenide compound semiconductor.

15. The method of claim 12 including selectively forming an oxidation prevention film on predetermined portions of the surface of said compound semiconductor device.

16. The method of claim 12 or 13 wherein said vapor is formed by evaporating a solid phase arsenic oxide.

17. The method of claim 16 wherein said compound semiconductor device and said solid phase arsenic oxide are placed in a furnace having a higher temperature region and a lower temperature region, respectively, such that said compound semiconductor device is placed in said higher temperature region and said solid phase arsenic oxide is placed in said lower temperature region.

18. The method of claim 12 or 13 wherein said vapor is formed by flowing a carrier gas containing oxygen onto an arsenic source and reacting with said arsenic source.

19. A method of making a compound semiconductor device, including at least one compound of arsenic in a portion thereof and an oxide film on the surface thereof annealing said compound semiconductor device in a vapor containing arsenic oxide whereby the chemical quality of said oxide is improved.

20. The method of claim 19 wherein the arsenic oxide is arsenic tri-oxide containing $As_4O_6$.

21. The method of claim 20 wherein said compound semiconductor device is composed of a gallium arsenide compound semiconductor.

22. The method of claim 19 including selectively forming an oxidation prevention film on predetermined portions of the surface of said compound semiconductor device prior to said heat-treatment.

23. The method of claim 19 or 20 wherein said vapor is formed by evaporating a solid phase arsenic oxide.

24. The method of claim 23 wherein said compound semiconductor device and said solid phase arsenic oxide are placed in a furnace having a higher temperature region and a lower temperature region, respectively, such that said compound semiconductor device is placed in said higher temperature region and said solid phase arsenic oxide is placed in said lower temperature region.

25. The method of claim 19 or 20 wherein said vapor is formed by contacting a carrier gas containing oxygen onto an arsenic source and reacting with said arsenic source.

* * * * *